(12) United States Patent
Kaneda

(10) Patent No.: US 9,704,909 B2
(45) Date of Patent: Jul. 11, 2017

(54) IMAGE SENSOR AND METHOD OF MANUFACTURING THE SAME

(71) Applicant: CANON KABUSHIKI KAISHA, Tokyo (JP)

(72) Inventor: Tasuku Kaneda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/072,708

(22) Filed: Mar. 17, 2016

(65) Prior Publication Data
US 2016/0284757 A1 Sep. 29, 2016

(30) Foreign Application Priority Data
Mar. 25, 2015 (JP) ................. 2015-063370

(51) Int. Cl.
 *H01L 27/148* (2006.01)
 *H01L 27/146* (2006.01)
 *H01L 23/26* (2006.01)

(52) U.S. Cl.
 CPC ........ *H01L 27/14643* (2013.01); *H01L 23/26* (2013.01); *H01L 27/1463* (2013.01); *H01L 27/14689* (2013.01)

(58) Field of Classification Search
 CPC ......... H01L 27/14643; H01L 27/14612; H01L 27/14603; H01L 27/1463; H01L 23/26
 USPC ................................ 257/225, 463
 See application file for complete search history.

(56) References Cited

U.S. PATENT DOCUMENTS

| 7,470,944 B2 | 12/2008 | Ishida et al. | |
|---|---|---|---|
| 2005/0104100 A1* | 5/2005 | Ishida | H01L 21/3221 257/292 |
| 2005/0179053 A1* | 8/2005 | Ezaki | H01L 27/14603 257/189 |
| 2006/0261386 A1* | 11/2006 | Tanaka | H01L 27/14689 257/292 |
| 2008/0283726 A1* | 11/2008 | Uya | H01L 27/14603 250/208.1 |
| 2010/0203670 A1* | 8/2010 | Ohtani | H01L 21/76895 438/98 |

(Continued)

FOREIGN PATENT DOCUMENTS

| JP | S63-248159 A | 10/1988 |
|---|---|---|
| JP | S63-254764 A | 10/1988 |

(Continued)

*Primary Examiner* — Benjamin Sandvik
*Assistant Examiner* — Herve Assouman
(74) *Attorney, Agent, or Firm* — Fitzpatrick, Cella, Harper & Scinto

(57) ABSTRACT

An image sensor is provided. The sensor comprises a plurality of photoelectric conversion elements each including a charge accumulation region of a first conductivity type arranged in a semiconductor substrate and an element isolation region arranged between the charge accumulation regions adjacent to each other. The element isolation region includes an insulator isolation portion arranged on an inner side of a trench on a surface of the semiconductor substrate, and includes a semiconductor region of a second conductivity type opposite to the first conductivity type arranged along a side surface of the insulator isolation portion. A gettering region is arranged between the semiconductor region and the insulator isolation portion along at least a part of the side surface of the insulator isolation portion.

18 Claims, 10 Drawing Sheets

(56) References Cited

U.S. PATENT DOCUMENTS

2010/0267184 A1* 10/2010 Noh .................. H01L 21/26506
                                                        438/58

FOREIGN PATENT DOCUMENTS

| JP | 2004-031677 A | 1/2004 |
| JP | 2008-010544 A | 1/2008 |
| JP | 2009-194269 A | 8/2009 |
| JP | 2012-204492 A | 10/2012 |

* cited by examiner

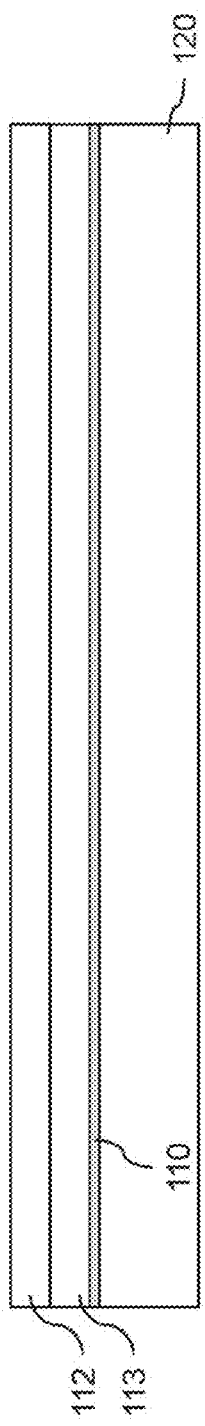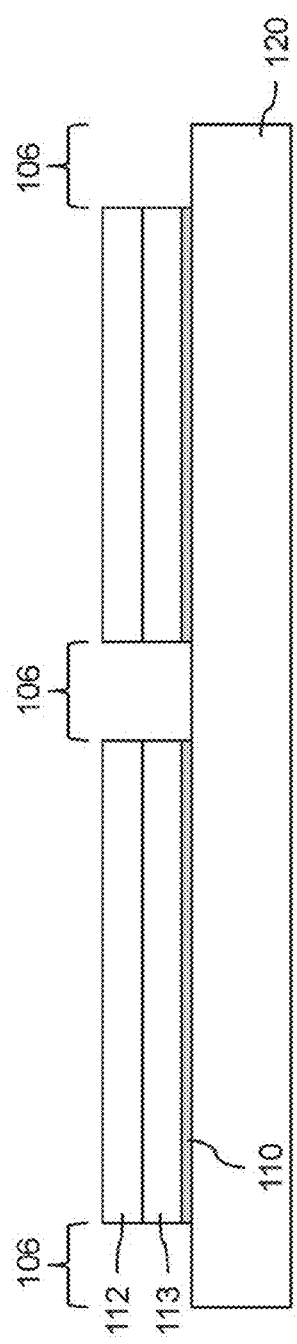

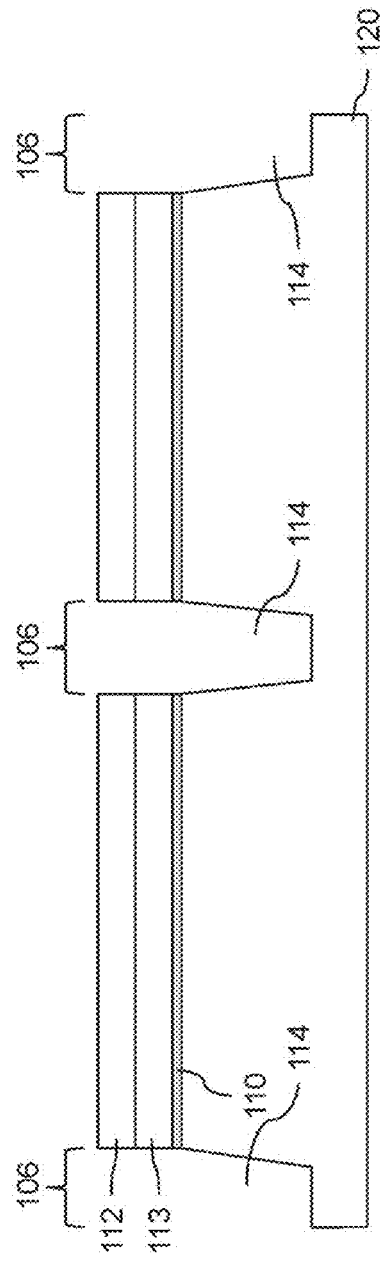
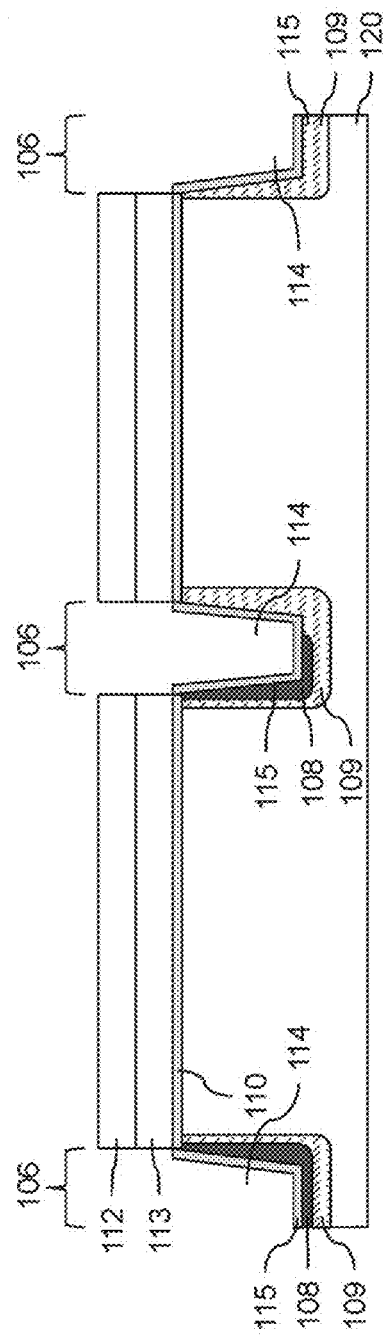

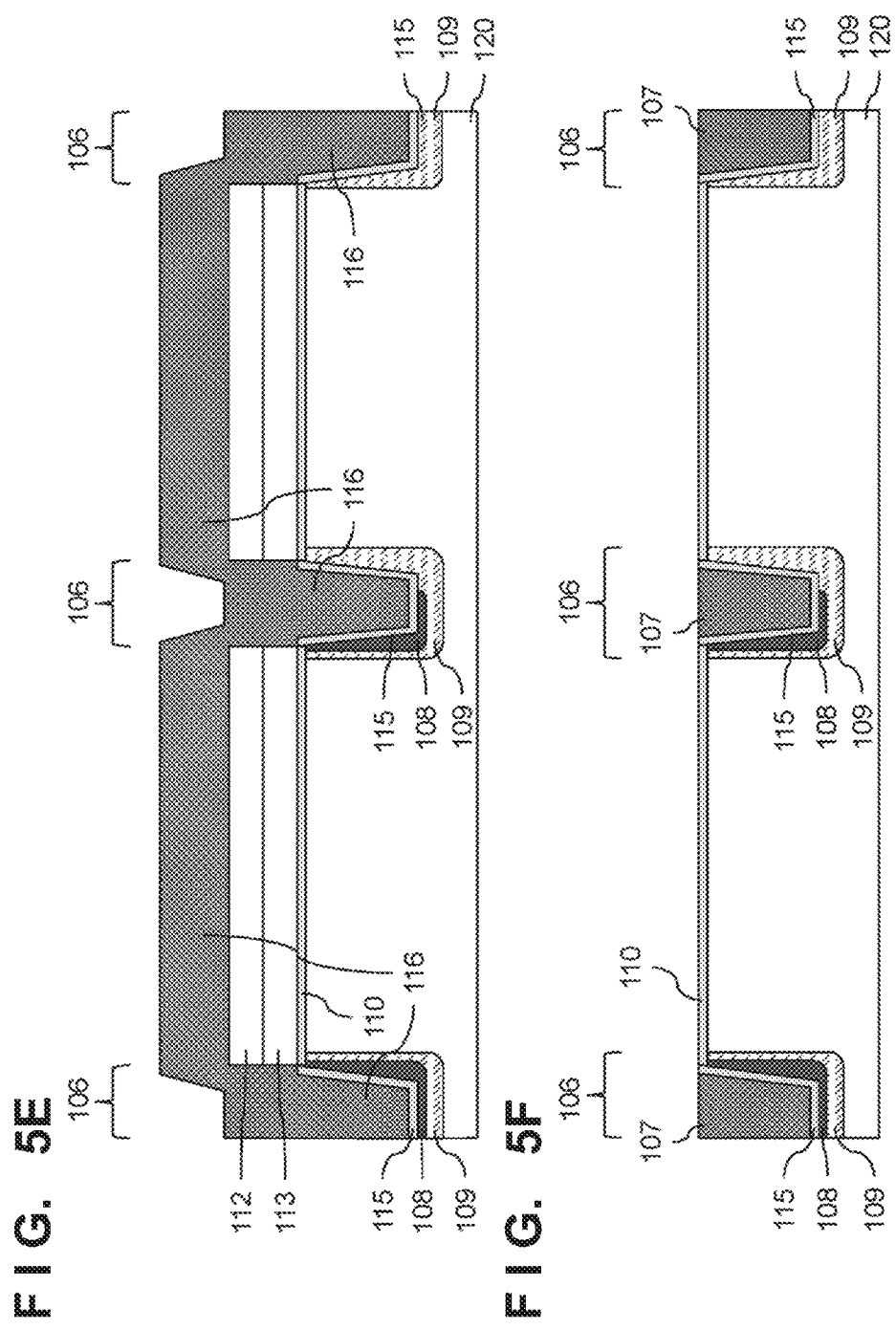

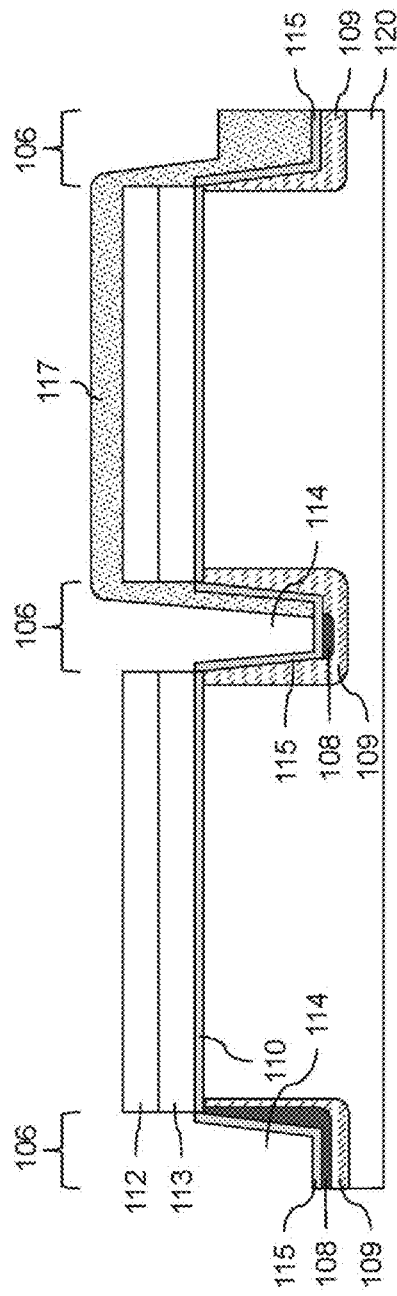
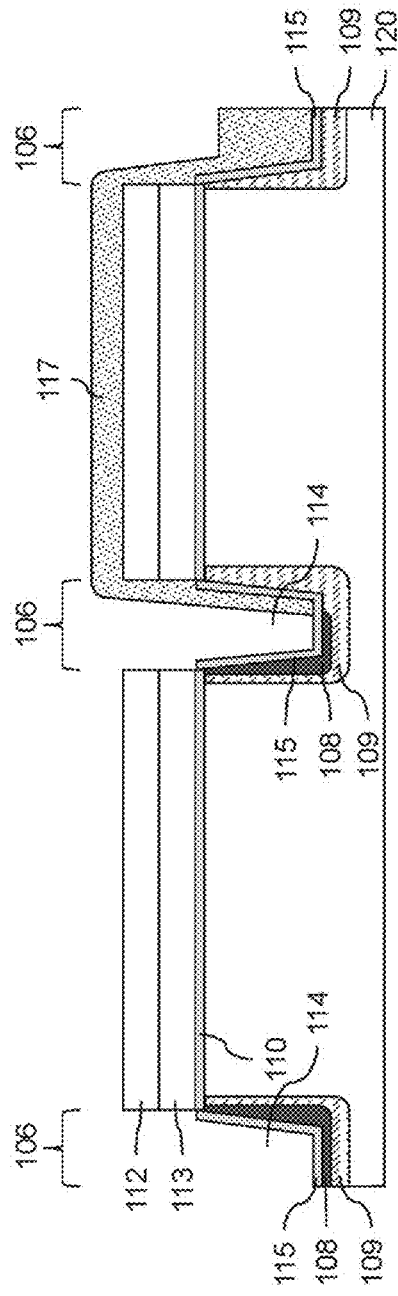

IMAGE SENSOR AND METHOD OF MANUFACTURING THE SAME

BACKGROUND OF THE INVENTION

Field of the Invention

The present invention relates to an image sensor and a method of manufacturing the same.

Description of the Related Art

A white spot is given as a drawback unique to an image sensor. The white spot is noise generated when an impurity such as a heavy metal or a crystal defect exists in a photoelectric conversion element. A defective layer is formed in a semiconductor substrate with respect to this noise and the impurity is gettered in the defective layer by annealing during a manufacturing process, reducing noise. In recent years, a technique of forming a defective layer in an element isolation region in the vicinity of a photoelectric conversion element has been proposed. Japanese Patent Laid-Open No. 2009-194269 has disclosed a structure which includes a defective layer in a position deeper than the bottom of a trench element isolation (STI) arranged above an element isolation region out of element isolation regions between photoelectric conversion elements.

SUMMARY OF THE INVENTION

In an image sensor, the adoption of a miniaturization process by a pixel size reduction advances in order to achieve a multiple pixel structure. For dopant diffusion control or reducing a stress, low-temperature annealing is used in the miniaturization process. Meanwhile, in a structure of Japanese Patent Laid-Open No. 2009-194269, a defective layer is formed in a deep region of a semiconductor substrate. It is therefore difficult to getter, by this low-temperature annealing, an impurity such as a heavy metal in the defective layer formed in the deep region when this impurity is introduced in the vicinity of the surface of the semiconductor substrate.

Some embodiments of the present invention provide a technique of reducing noise by improving a gettering effect and suppressing charge emission caused by the gettered impurity.

According to some embodiments, an image sensor comprising: a plurality of photoelectric conversion elements each including a charge accumulation region of a first conductivity type arranged in a semiconductor substrate; and an element isolation region arranged between the charge accumulation regions adjacent to each other, wherein the element isolation region includes an insulator isolation portion arranged on an inner side of a trench on a surface of the semiconductor substrate, and includes a semiconductor region of a second conductivity type opposite to the first conductivity type arranged along a side surface of the insulator isolation portion, and wherein a gettering region is arranged between the semiconductor region and the insulator isolation portion along at least a part of the side surface of the insulator isolation portion, is provided.

According to some other embodiments, a method of manufacturing an image sensor, the method comprising: forming a trench on a surface of a semiconductor substrate; forming a gettering region along a side surface of the trench by ion implantation; forming a semiconductor region along the side surface of the trench by ion implantation; filling the trench with an insulator; and forming a photoelectric conversion element adjacent to the semiconductor region, wherein the gettering region is positioned between the insulator and the semiconductor region.

Further features of the present invention will become apparent from the following description of exemplary embodiments (with reference to the attached drawings).

BRIEF DESCRIPTION OF THE DRAWINGS

FIGS. 5A to 5F are views showing the steps in a method of manufacturing an element isolation region of the image sensor in FIG. 1;

FIGS. 6A to 6D are views showing the steps in a method of manufacturing a gettering region of the image sensor in FIG. 1.

DESCRIPTION OF THE EMBODIMENTS

Figure 1:
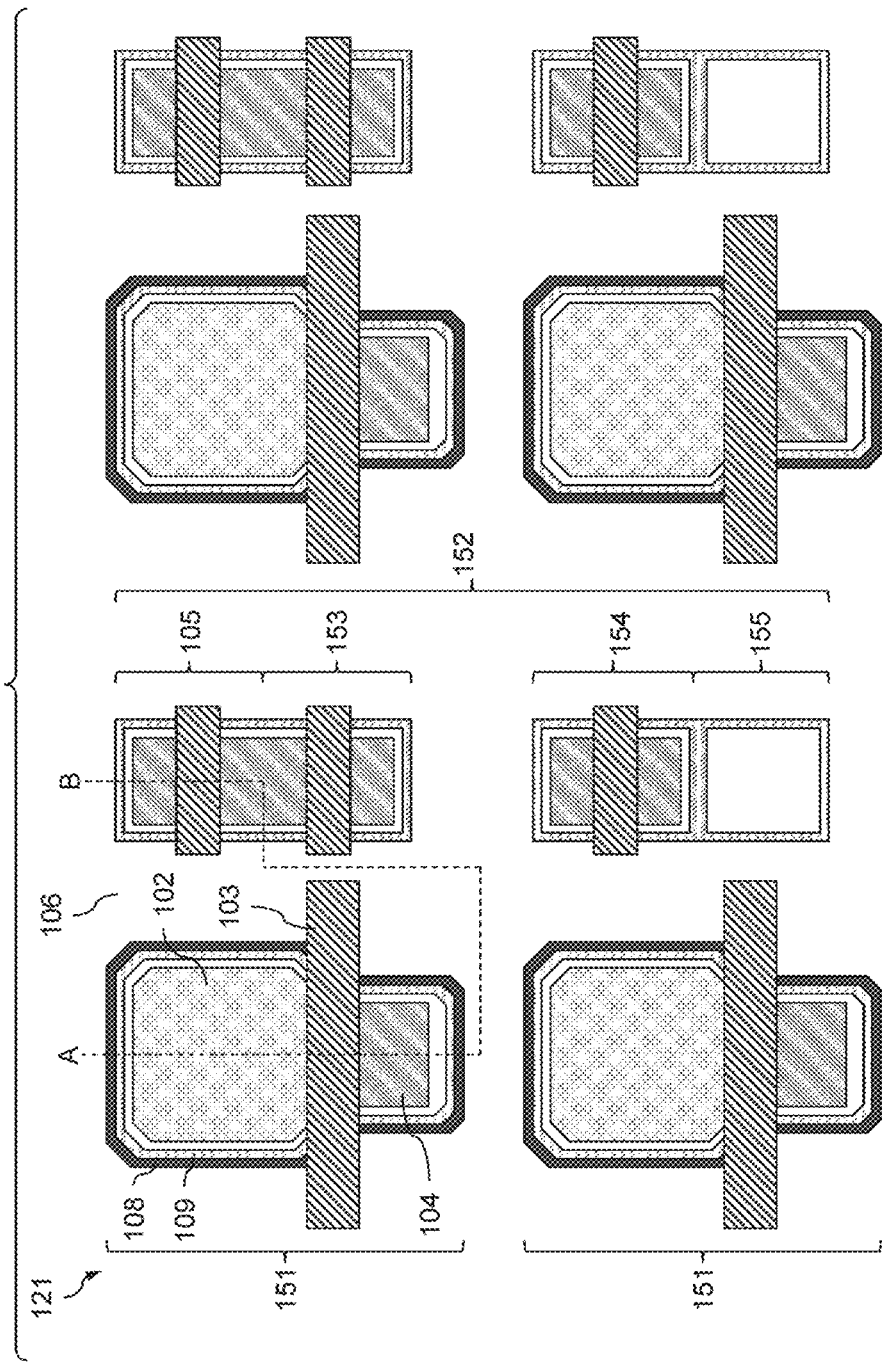
FIG. 1 is a plan view showing an image sensor according to an embodiment of the present invention.

A practical embodiment of an image sensor of the present invention will be described below with reference to the accompanying drawings. Note that in a description and the drawings below, common reference numerals denote common arrangements throughout the plurality of drawings. Therefore, the common arrangements will be described with reference to the plurality of drawings mutually and descriptions of the arrangements denoted by the common reference numerals will be omitted as needed.

FIG. 1 is a plan view showing a pixel region of an image sensor 121 according to this embodiment. In FIG. 1, constituent elements such as a contact, a wiring layer, a color filter, a microlens, and a peripheral circuit region of the image sensor 121 are omitted for simplicity. The pixel region of the image sensor 121 includes first element regions 151 and a second element region 152. Those element regions are also referred to as active regions. Each first element region 151 includes a charge accumulation region 102 of a photoelectric conversion element, a floating diffusion region (FD region) 104, and a transfer gate 103 which forms a channel between the charge accumulation region and the FD region 104. The charge accumulation region 102 is the first conductivity type which sets charges treated as signal charges in the photoelectric conversion element to majority carriers and is an n-type semiconductor region in this embodiment. The second element region 152 includes an amplification transistor 105, a selection transistor 153, a reset transistor 154, and a well contact 155 in the order from the top shown in FIG. 1. FIG. 1 shows a case in which one second element region 152 is provided for the two first element regions 151. However, for example, one second element region 152 may be provided for one first element region 151. Further, the arrangement of the second element region 152 is not limited to this. For example, only the amplification transistor 105 may be arranged.

In FIG. 1, an element isolation region 106 is arranged between the first element regions 151 and the second element region 152 adjacent to each other. The element isolation region is also referred to as a field region. Out of the element isolation region 106, the periphery of the first element regions 151 and the second element region 152 is surrounded by a channel stop region 109 as a p-type semiconductor region of the second conductivity type opposite to the first conductivity type. In each first element region 151 including the active region of the charge accumulation region 102 and the FD region 104, the channel stop region 109 sandwiches a gettering region 108 and surrounds the periphery of the first element region 151.

Figure 2:
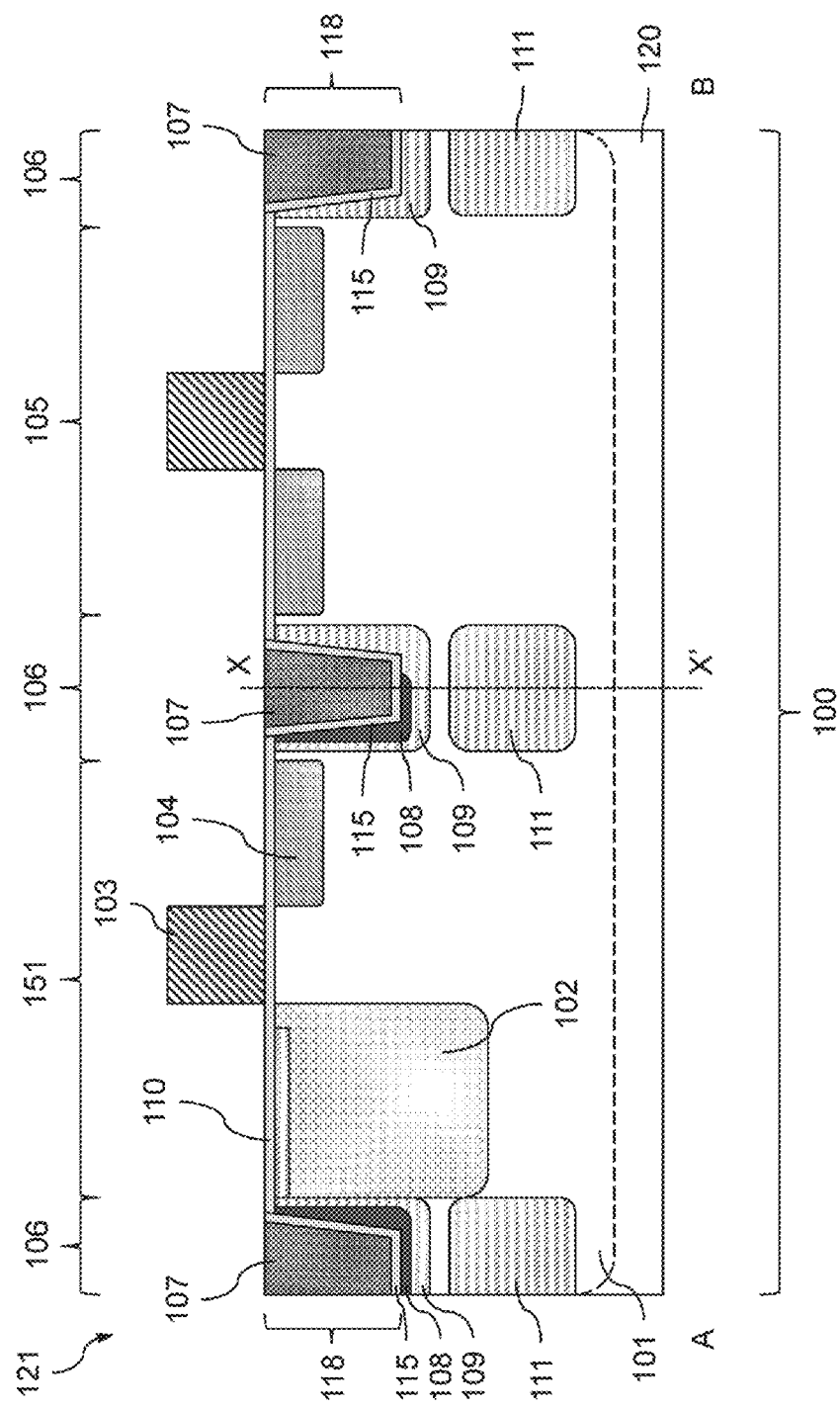
FIG. 2 is a sectional view showing the image sensor in FIG. 1.

FIG. 2 shows a sectional view taken along A-B of the image sensor 121 shown in FIG. 1. A pixel region 100 of the image sensor 121 is formed in a p-type well region 101 formed inside of a semiconductor substrate 120. In this embodiment, a description will be given assuming that the first conductivity type is an n type and the second conductivity type is a p type. However, the first conductivity type may be the p type and the second conductivity type may be the n type.

FIG. 2 shows the first element region 151 and the amplification transistor 105 arranged in the second element region 152 out of the second element region 152. The n-type charge accumulation region 102 and the p-type well region 101 form a pn photodiode serving as the photoelectric conversion element. The charge accumulation region 102 accumulates electrons of the n-type majority carriers out of electrons and holes generated in the pn photodiode upon reception of light in the image sensor 121. The transfer gate 103 forms the channel between the charge accumulation region 102 and the FD region 104 by changing the potential of the transfer gate 103, and transfers the charges accumulated in the charge accumulation region 102 to the FD region 104. The potential of the FD region 104 changes by transferring the charges via the channel from the charge accumulation region 102. The amplification transistor 105 outputs a signal corresponding to the potential of the FD region 104 to a column signal line (not shown). A signal corresponding to light entering the image sensor 121 is thus read out from the charge accumulation region 102. The selection transistor 153 is turned on when a pixel which outputs a signal is selected. The reset transistor 154 is turned on when the potential of the FD region 104 is reset. The potential of the well region 101 is supplied to the well contact 155.

The element isolation region 106 which isolates, from each other, the first element region 151 and the amplification transistor 105 adjacent to each other is arranged in the pixel region 100. A trench element isolation structure (Shallow Trench Isolation: STI) is provided in the element isolation region 106. In the trench element isolation structure, insulator isolation portions 118 are arranged inside trenches provided on the surface of the semiconductor substrate 120. Each insulator isolation portion 118 includes an insulator 107 which fills the trench and an insulation film 115 formed along the inner wall of the trench. The insulation film 115 can be omitted. In the element isolation region 106, the channel stop region 109 serving as the p-type semiconductor region is arranged so as to cover the insulator isolation portions 118.

In this embodiment, the gettering region 108 is arranged in the element isolation region 106. The gettering region 108 is arranged along at least a part of the side surface of each insulator isolation portion 118. Further, the gettering region 108 is arranged between the insulator isolation portions 118 and the channel stop region 109.

Furthermore, in this embodiment, the gettering region 108 is arranged along the side surfaces of the insulator isolation portions 118 between the insulator isolation portions 118, and the first element region 151 including the charge accumulation region 102 and the FD region 104. Meanwhile, on the side surfaces of the insulator isolation portions 118 between the insulator isolation portions 118 and the second element region 152 including the amplification transistor 105, the channel stop region 109 and the insulator isolation portion 118 contact each other, and the gettering region 108 is not arranged. However, the gettering region 108 may be provided on the side surfaces of the insulator isolation portions 118 between the second element region 152 and the insulator isolation portions 118. Also, for example, selection is appropriately made from the amplification transistor 105, the selection transistor 153, and the reset transistor 154, and then the gettering region 108 may be provided on the side surfaces of the insulator isolation portions 118 between the selected transistor and the insulator isolation portions 118.

In this embodiment, the gettering region 108 is formed between the channel stop region 109, and the insulator 107 and the insulation film 115 of the insulator isolation portions 118. However, for example, the gettering region 108 may be formed throughout the inside of the insulator 107 and the insulation film 115 of the insulator isolation portions 118 as long as it is inside of the channel stop region 109. Also, for example, the gettering region 108 may be formed on the bottom surface of each insulator isolation portion 118 inside of the channel stop region 109.

The effect of this embodiment will now be described. For example, damage due to etching when forming the image sensor 121, a metal impurity, a crystal lattice strain, a crystal defect, and the like may exist in the photoelectric conversion element and its neighborhood. A white spot may be generated by these influences. In addition, noise of a signal read out from the first element region 151 may increase. The gettering region having a defect in the semiconductor substrate 120 is formed with respect to this noise. By doing so, an impurity is captured and made harmless by the defect in the gettering region apart from the charge accumulation region 102 serving as the active region of the photoelectric conversion element by annealing during a manufacturing process of the image sensor 121 even if the impurity is introduced in a wafer in the manufacturing process. Along with miniaturization of the image sensor 121, however, high-temperature annealing cannot be used in the manufacturing process of the image sensor 121 and a low-temperature annealing process is used in order to, for example, maintain the profile of an impurity concentration. In this case, in a gettering region provided in the deep position of a semiconductor substrate disclosed in Japanese Patent Laid-Open No. 2009-194269, it is difficult to exhibit a gettering effect when an impurity is introduced in the vicinity of a silicon substrate surface by, for example, an etching process of forming a trench for forming the STI.

In this embodiment, however, the gettering region 108 is arranged between the insulator isolation portions 118 and the charge accumulation region 102 serving as the active region of the photoelectric conversion element in the first element region 151 along the side surfaces of the insulator isolation portions 118. This allows, even in a low-temperature thermal history process, effective gettering for the impurity introduced in the vicinity of the silicon substrate surface. This makes it possible to reduce noise such as the white spot. The gettering region 108 is formed inside of the channel stop region 109 between the channel stop region 109 and the insulator isolation portions 118. Therefore, the channel stop region 109 forms a potential barrier between the charge accumulation region 102 and the gettering region 108 even if the charges owing to the level of the impurity such as a heavy metal are emitted in the gettering region 108. This makes it possible to suppress the inflow of the electrons from the element isolation region 106 into the charge accumulation region 102 which forms the photoelectric conversion element and to suppress occurrence of noise.

Figure 3A:
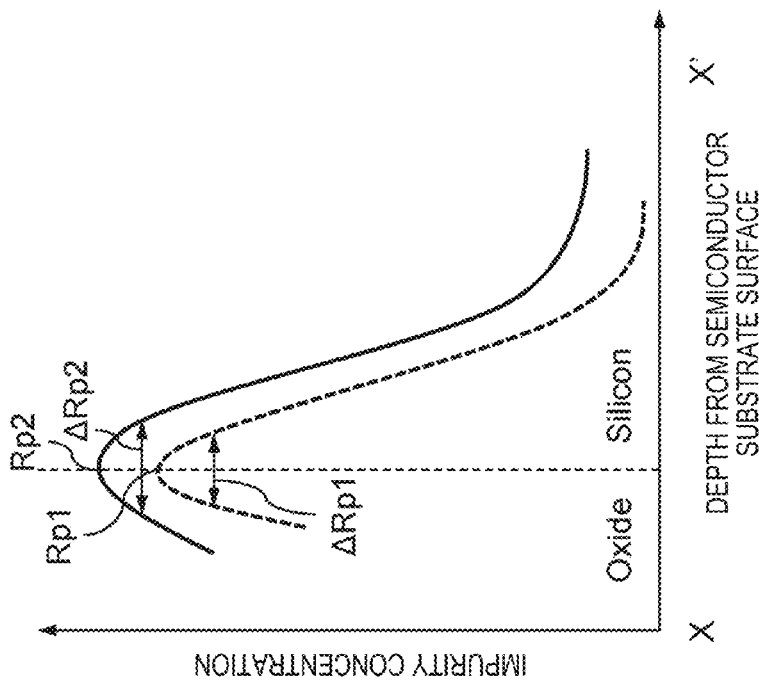
FIGS. 3A and 3B are graphs each showing impurity concentrations in a gettering region and a channel stop region of the image sensor in FIG. 1.
Figure 3B:
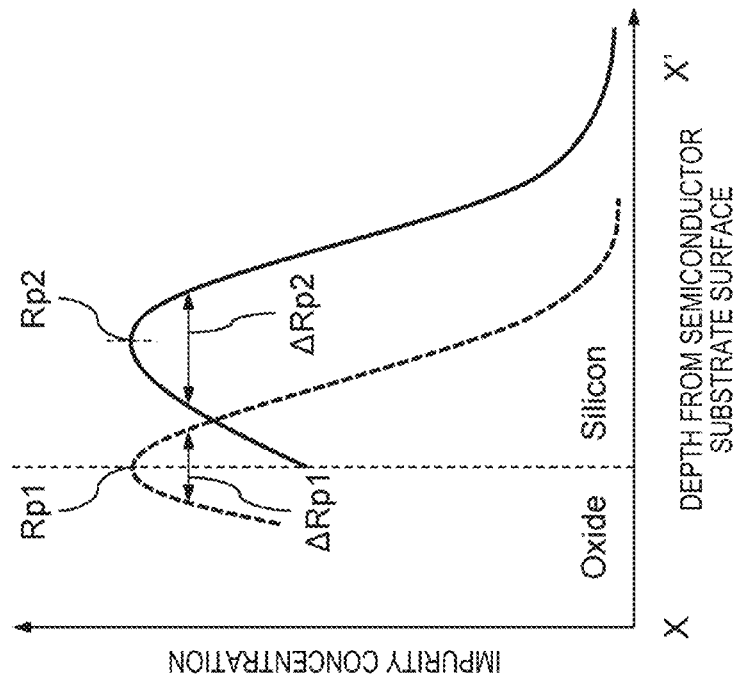

Each of FIGS. 3A and 3B shows the relationship of the impurity concentration along the depth direction of the semiconductor substrate 120 between the gettering region 108 and the channel stop region 109 along X-X' in FIG. 2. In each of FIGS. 3A and 3B, the abscissa axis indicates a depth from the surface of the substrate and the ordinate axis indicates the impurity concentration. In this embodiment, the gettering region 108 is formed by implanting an impurity such as an inactive element into the semiconductor substrate 120 and generating a defect. A broken line indicates the distribution of the impurity concentration in the gettering region 108. A solid line indicates the distribution of a p-type impurity concentration in the channel stop region 109. In each of FIGS. 3A and 3B, let Rp1 be a peak position of the impurity concentration in the gettering region 108 and ΔRp1 be a standard deviation spreading from a peak. Likewise, let Rp2 be a peak position of the impurity concentration in the channel stop region 109 and ΔRp2 be a standard deviation spreading from a peak.

Each of FIGS. 3A and 3B shows the relationship of the impurity concentration between the gettering region 108 and the channel stop region 109 in this embodiment. However, the relationship of the impurity concentration is not limited to this. Any concentration relationship may be formed as long as a concentration distribution has the above-described gettering effect and an effect of reducing noise caused by the gettered impurity.

As shown in FIG. 3A, in the relationship of the impurity concentration, the profile of the impurity concentration in the gettering region 108 may be formed in a shallower position as compared with the profile of the impurity concentration in the channel stop region 109. In this case, Rp1 of the gettering region 108 is formed in a position shallower than Rp2 of the channel stop region 109 in the depth direction from the surface of the semiconductor substrate 120, or in other words, between Rp2 and the surface of the semiconductor substrate 120. Also, spreading of ΔRp1 has the distribution in the shallower position closer to the surface of the semiconductor substrate 120 than spreading of ΔRp2. As shown in FIG. 3B, the relationship of the impurity concentration may be formed such that Rp1 and Rp2 are arranged at the same depth from the surface of the semiconductor substrate 120, and the profile of the channel stop region 109 contains the profile of the impurity concentration in the gettering region 108. In this case, the impurity concentration in the gettering region 108 becomes lower than that in the channel stop region 109 at the same depth from the surface of the semiconductor substrate 120.

The potential barrier caused, by the channel stop region 109, between the gettering region 108 and the charge accumulation region 102 becomes higher when the profile is formed so as to have the concentration distribution in FIG. 3A out of the concentration distributions shown in FIGS. 3A and 3B. This makes it possible to suppress the inflow of the charges owing to the level of the gettered impurity from the gettering region 108 into the charge accumulation region 102 and to suppress occurrence of noise more effectively.

As shown in FIG. 2, the lower end of the charge accumulation region 102 may be arranged in a deeper position of the depth from the surface of the semiconductor substrate 120 than the lower end of the gettering region 108. For example, a position where a concentration of half of the peak of the impurity concentration in the charge accumulation region 102 is obtained may be a position deeper than a position where a concentration of half of the peak of the impurity concentration in the gettering region 108 is obtained. The impurity introduced during the manufacturing process of the image sensor 121 is likely to adhere to the surface of the semiconductor substrate 120. Therefore, the gettering region 108 may be arranged in a region close to the surface of the semiconductor substrate 120 out of the charge accumulation region 102.

Figure 4:
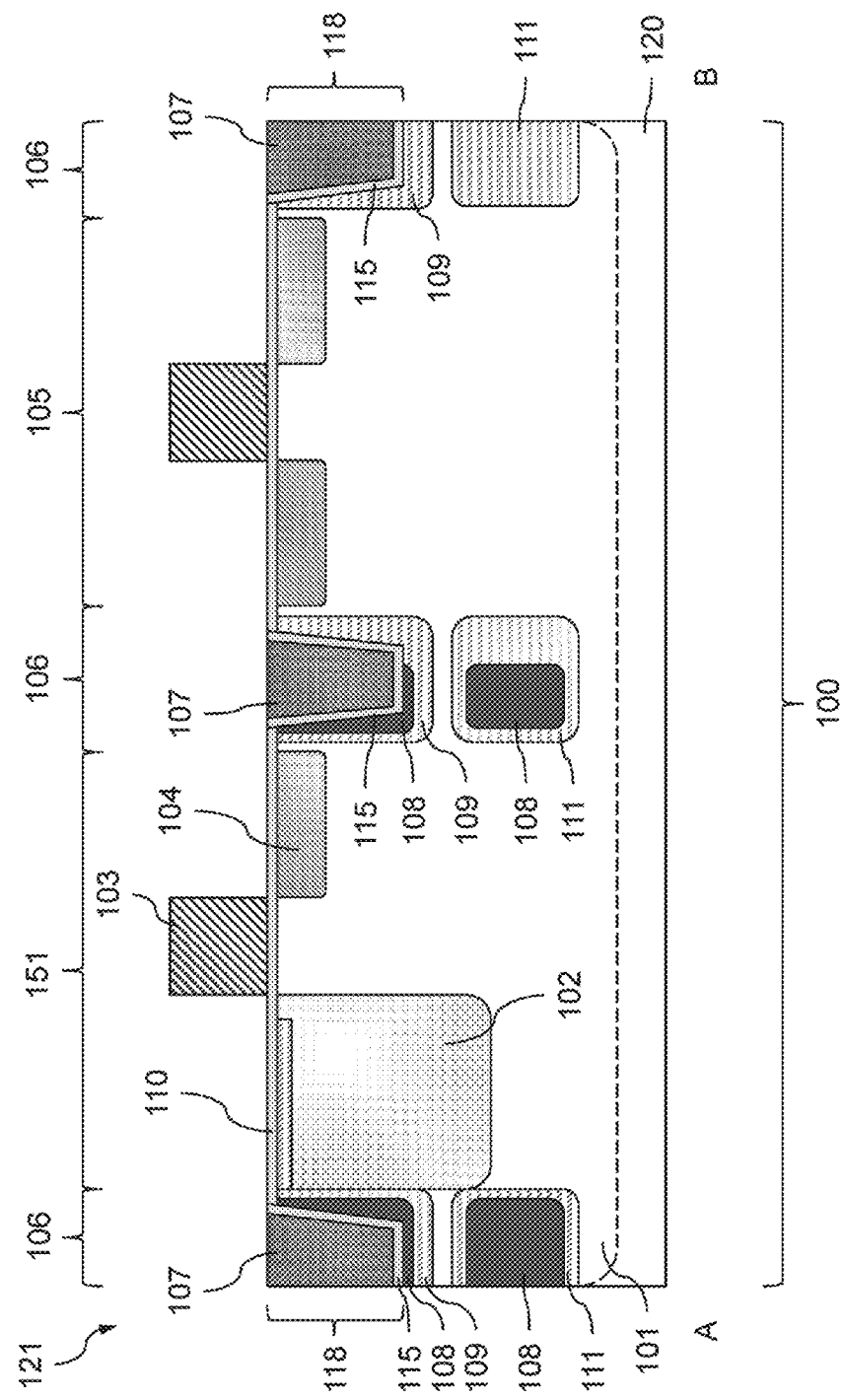
FIG. 4 is a sectional view showing a modification of the image sensor in FIG. 1.

Further, the gettering region 108 may be formed not only on the periphery of the insulator isolation portions 118 but also in a deeper position from the surface of the semiconductor substrate 120 out of the element isolation region 106. For example, as shown in FIG. 4, a semiconductor isolation portion 111 which is a p-type semiconductor region like the channel stop region 109 and configured to isolate pixels from each other is formed in a deeper position from the surface of the semiconductor substrate 120 than the insulator isolation portion 118 and the channel stop region 109 of the element isolation region 106. The semiconductor isolation portion 111 suppresses charge mixture among the pixels by forming the potential barrier with a pn junction or the high and low impurity concentrations in a region of the same conductivity type. For example, the semiconductor isolation portion 111 arranged so as to contact the outer edge of the first element regions 151 may include the gettering region 108 inside the semiconductor isolation portion 111. In this case, the volume of the gettering region 108 relative to one of the first element regions 151 increases. It also becomes possible to effectively getter not only an impurity in a shallow region of the semiconductor substrate 120 but also a defect and an impurity introduced in a deep region. This increases suppression of noise such as the white spot.

A step of forming the element isolation region 106 out of a method of manufacturing the image sensor 121 of this embodiment will now be described with reference to FIGS. 5A to 7B. Steps of forming, other than the element isolation region 106, the well region 101, the charge accumulation region 102, the FD region 104, the respective transistors, and the like which constitute the image sensor 121 can be achieved by using an existing method. A detailed description thereof is thus omitted.

In this embodiment, a silicon substrate is used as the semiconductor substrate 120. First, an oxide film (pad oxide film) 110 is formed by oxidizing the surface of the silicon substrate. After forming the pad oxide film 110, polysilicon 112 and a silicon nitride film 113 are formed by using, for example, a CVD method. FIG. 5A shows a state at this time.

Next, as shown in FIG. 5B, the polysilicon 112 and the silicon nitride film 113 in a region where the element isolation region 106 is formed are removed in the pixel region 100 of the image sensor 121. More specifically, a resist film is formed on the silicon nitride film 113 and is patterned by using, for example, a photolithography process. This forms a resist pattern having openings in portions where the element isolation region 106 is formed. Then, by using the formed resist pattern as a mask, the silicon nitride film 113, the polysilicon 112, and the pad oxide film 110 are etched with, for example, an anisotropic dry etching method. By doing so, a hard mask having opening portions corresponding to the element isolation region 106 of the semiconductor substrate 120 and constituted by the silicon nitride film 113, the polysilicon 112, and the pad oxide film 110 is formed. After forming the hard mask, the resist pattern is removed.

Then, by using the hard mask constituted by the silicon nitride film 113, the polysilicon 112, and the pad oxide film 110, a step of etching the semiconductor substrate 120 in the opening portions of the hard mask and forming trenches 114 for arranging the insulator isolation portions 118 of the element isolation region 106 is performed. The depth of each trench 114 from the surface of the semiconductor substrate 120 is, for example, 50 to 500 nm, and more particularly, about 250 nm. FIG. 5C shows a state at this time.

After forming the trenches 114, the gettering region 108 and the channel stop region 109 are formed in the element isolation region 106 by using the hard mask constituted by the silicon nitride film 113, the polysilicon 112, and the pad oxide film 110 again. The insulation film 115 is formed on the side surface and the bottom surface of each trench 114 before forming the gettering region 108 and the channel stop region 109. The insulation film 115 having the thickness of about 35 nm is formed by using, for example, a thermal oxidation method in an oxidizing gas atmosphere. Then, a first implantation step of forming the gettering region 108 is performed. As the first implantation processing, for example, carbon as a Group 14 element of a valence of four is implanted along the inner wall of each trench 114 to be at the depth of about 0.3 μm or less from the surface of the semiconductor substrate 120 by using an ion implantation method or the like. By doing so, the gettering region 108 is formed. After that, a second implantation step of forming the channel stop region 109 is performed. As the second implantation method, for example, boron as a p-type impurity is implanted into a region deeper than a region where carbon has been implanted as the gettering region 108 and, for example, at about 0.4 μm from the surface of the semiconductor substrate 120. By doing so, the channel stop region 109 of a p-type conductivity type is formed. Each formation depth of the gettering region 108 and the channel stop region 109 may be changed depending of the depth of each trench 114. However, the gettering region 108 is arranged between the channel stop region 109 and the insulator isolation portions 118 inside of the channel stop region 109. FIG. 5D shows a state in which the gettering region 108 and the channel stop region 109 are formed.

In a step of forming the insulation film 115, the gettering region 108, and the channel stop region 109, the gettering region 108 and the channel stop region 109 may be formed before forming the insulation film 115 on the side surface and the bottom surface of each trench 114. In this case, thermal history when forming the insulation film 115 can be utilized as annealing for gettering the impurity.

Figure 6A:
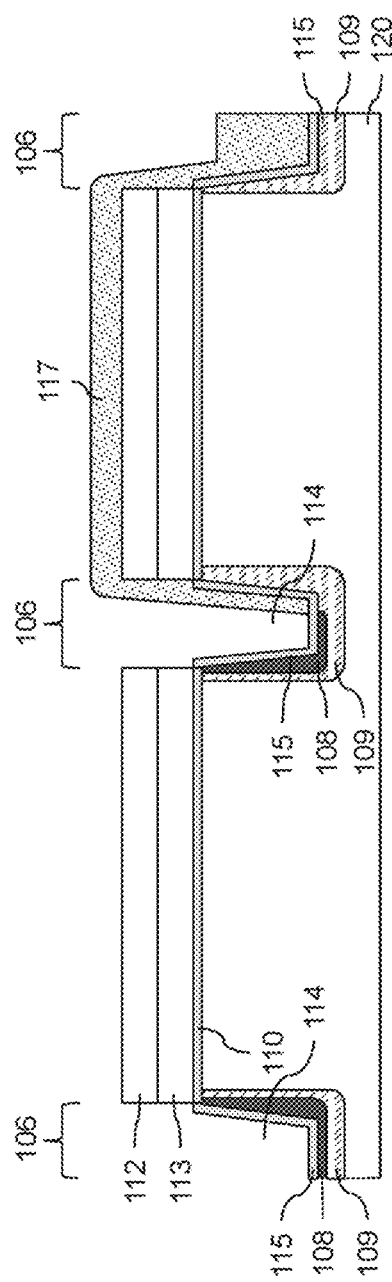

Note that as a method of forming the gettering region 108, the gettering region 108 may be formed on the bottom or the side wall of each trench 114 at once by performing ion implantation at a tilt angle of about, for example, 25° over the insulation film 115 on the inner wall of each trench 114, as shown in FIG. 6A. Also, in this case, the element isolation region 106 on the periphery of the amplification transistor 105 where the gettering region 108 is not formed is protected by a resist 117 as shown in FIG. 6A to avoid implantation. In this case, the gettering region 108 is not arranged in the element isolation region 106 on the periphery of the amplification transistor 105. This makes it possible to reduce the influence of Coulomb scattering on channel electrons of the amplification transistor 105 caused by the impurity captured in the gettering region 108 and to suppress a decrease in mobility.

Figure 6B:
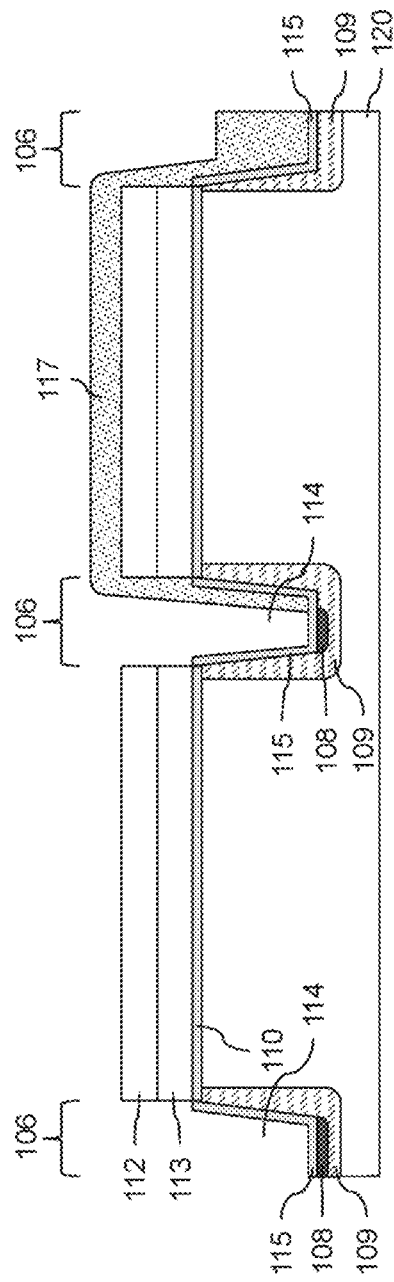

The gettering region 108 is formed only on the bottom of each trench 114 by performing ion implantation into the gettering region 108 at a small tilt angle of, for example, 0° over the insulation film 115 on the inner wall of each trench 114, as shown in FIG. 6B. Then, the gettering region 108 is formed on the side wall of each trench 114 by performing ion implantation at a large tilt angle of about 40°, as shown in FIGS. 6C and 6D. As described above, the gettering region 108 need not always be formed by one-time implantation, but may be formed by changing the tilt angle and performing implantation a plurality of times.

An element contained by the gettering region 108 by implanting it into the gettering region 108 is not limited to carbon. As an impurity for generating a defect, for example, at least one type out of the Group 14 elements such as carbon, silicon, and germanium may be selected and implanted as needed to be contained by the gettering region 108. Also, for example, oxygen or nitrogen may be implanted and chemically bonded with the material of the semiconductor substrate 120. The gettering region 108 contains oxygen or nitrogen. In this case, a defect may be generated by implanting oxygen or nitrogen at the ratio, for example, smaller than the stoichiometric ratio to the material of the semiconductor substrate 120 and be used as the gettering region 108.

A filling step of filling each trench 114 with the insulator is performed after forming the gettering region 108 and the channel stop region 109. As shown in FIG. 5E, an insulator 116 is formed above the semiconductor substrate 120. The insulator 116 can be silicon oxide formed by using, for example, a high-density plasma CVD method. Then, an upper-side portion of the upper surface of the pad oxide film 110 is removed by using, for example, a CMP method. By doing so, the element isolation region 106, which includes the insulator isolation portions 118 including the insulator 107 and the insulation film 115, the gettering region 108, and the channel stop region 109, shown in FIG. 5F, is formed.

As described above, by forming the gettering region 108 and the channel stop region 109 when forming the trenches 114, it becomes possible to provide the gettering region 108 and the channel stop region 109 near the charge accumulation region 102 by self alignment with respect to the trenches 114. It becomes possible to improve the gettering effect of the impurity existing in the vicinity of the charge accumulation region 102 which forms the photoelectric conversion element even in low-temperature annealing by arranging the gettering region 108 near the charge accumulation region 102. It also becomes possible to reduce noise owing to the level of the gettered impurity by covering the gettering region 108 with the channel stop region 109.

Figure 7A:
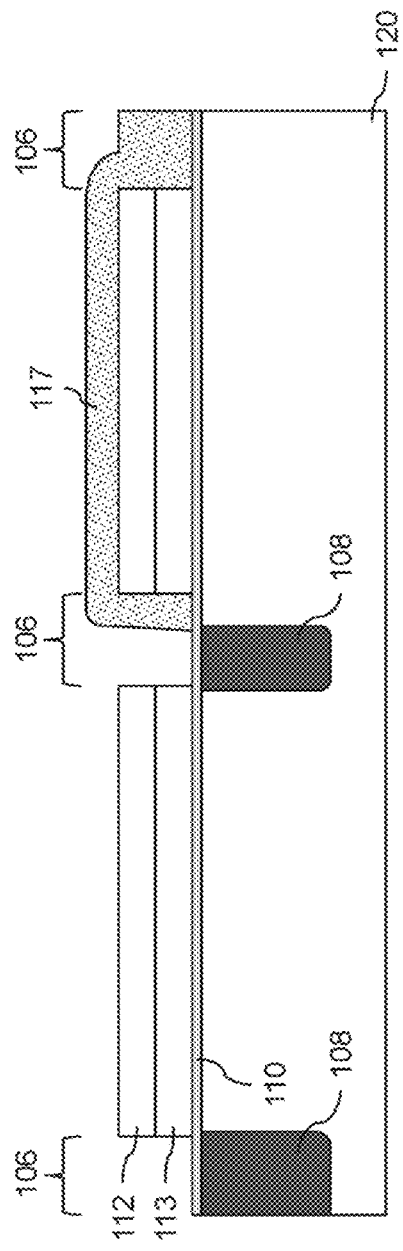
FIGS. 7A and 7B are views showing modifications of the method of manufacturing the gettering region of the image sensor in FIG. 1.
Figure 7B:
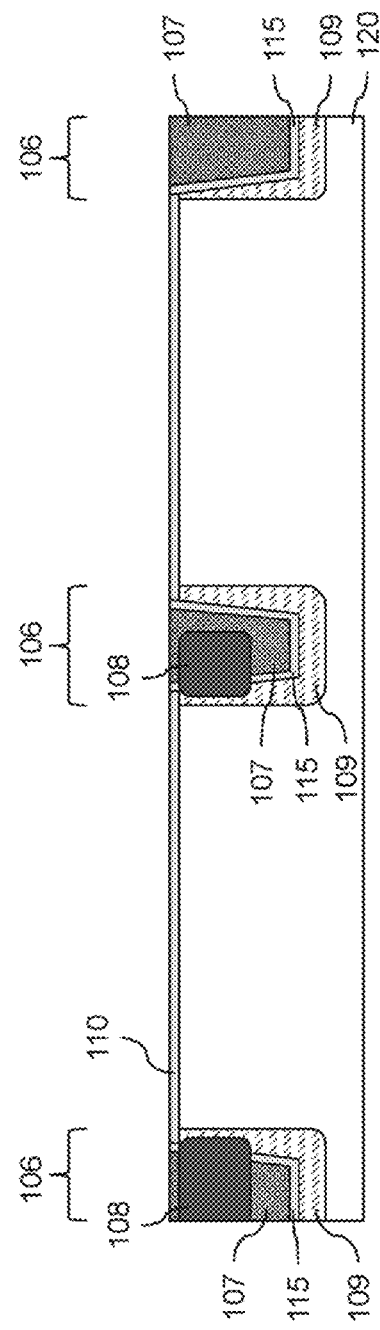

The method of forming the element isolation region 106 is not limited to the above-described method. An arrangement in which the gettering region 108 is arranged between the channel stop region 109 and the insulator isolation portions 118 along the side surface of the STI of the element isolation region 106 facing each first element region 151 is also possible. For example, in the step of FIG. 5B, before etching the pad oxide film 110, the gettering region 108 may be formed by implanting carbon ions or the like by using the polysilicon 112 and the silicon nitride film 113 as the hard mask, as shown in FIG. 7A. After forming the gettering region 108, a step other than the formation step of the gettering region 108 out of steps shown after FIG. 5C may be performed. For example, as shown in FIG. 7B, the gettering region 108 may be formed after planarizing the insulator 116 and forming the insulator 107 without performing the first implantation step for forming the gettering region 108 in the step of FIG. 5D. In this case, impurity implantation is performed while protecting a portion other than a portion where the gettering region 108 is formed by using, for example, a resist mask. At this time, the gettering region 108 may be formed throughout the inside of the insulator 107 and the insulation film 115 of the insulator isolation portions 118, as shown in FIG. 7B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-063370, filed Mar. 25, 2015 which is hereby incorporated by reference wherein in its entirety.

What is claimed is:

1. An image sensor comprising:
a plurality of photoelectric conversion elements each including a charge accumulation region of a first conductivity type arranged in a semiconductor substrate; and
an element isolation region arranged at least between the charge accumulation regions adjacent to each other,
wherein the element isolation region includes an insulator isolation portion arranged on an inner side of a trench on a surface of the semiconductor substrate, and includes a semiconductor region of a second conductivity type opposite to the first conductivity type, and the semiconductor region is arranged along a side surface of the insulator isolation portion,
wherein a gettering region is arranged between the semiconductor region and the insulator isolation portion, and the gettering region is arranged along at least a part of the side surface of the insulator isolation portion between the charge accumulation region and the side surface of the insulator isolation portion, and
wherein the gettering region contains at least one of carbon or germanium.

2. The sensor according to claim 1, comprising:
a first region which has the charge accumulation region, a floating diffusion region, and a transfer gate configured to form a channel between the charge accumulation region and the floating diffusion region;
a second region which has an amplification transistor; and
a third region which has the element isolation region, the third region being arranged between the first region and the second region,
wherein between the first region and the element isolation portion of the third region, the gettering region is arranged between the semiconductor region and the insulator isolation portion along the side surface of the insulator isolation portion, and
wherein between the second region and the insulator isolation portion of the third region, the semiconductor region is arranged in contact with the insulator isolation portion along the side surface of the insulator isolation portion.

3. The sensor according to claim 1, wherein a peak position of an impurity concentration in the gettering region is present between the surface of the semiconductor substrate and a peak position of an impurity concentration in the semiconductor region.

4. The sensor according to claim 1, wherein an impurity concentration in the gettering region is lower than an impurity concentration in the semiconductor region at the same depth from the surface of the semiconductor substrate.

5. The sensor according to claim 1, wherein a lower end of each charge accumulation region is deeper than a lower end of the gettering region.

6. The sensor according to claim 1, wherein the element isolation region further includes a semiconductor isolation portion of the second conductivity type arranged in a position deeper than the semiconductor region,
wherein the gettering region is arranged in an inner side of the semiconductor isolation portion.

7. The sensor according to claim 1, wherein the gettering region contains carbon.

8. The sensor according to claim 1, wherein the gettering region contains one of oxygen and nitrogen.

9. A method of manufacturing an image sensor, the method comprising:
forming a trench on a surface of a semiconductor substrate;
forming a gettering region along a side surface of the trench by ion implantation of at least one of carbon or germanium;
forming a semiconductor region along the side surface of the trench by ion implantation of an impurity;
filling the trench with an insulator after the forming of the gettering region and the semiconductor region; and
forming a photoelectric conversion element adjacent to the semiconductor region,
wherein the gettering region is positioned between the insulator and the semiconductor region and between a side surface of the insulator and the photoelectric conversion element.

10. The method according to claim 9, wherein the semiconductor region is formed after forming the gettering region.

11. The sensor according to claim 2, wherein the gettering region is further arranged between the semiconductor region of the third region and the insulator isolation portion of the third region along at least a part of the side surface of the insulator isolation portion of the third region and between the floating diffusion region and the side surface of the insulator isolation portion of the third region.

12. The sensor according to claim 4, wherein the impurity concentration in the gettering region is a concentration of at least one of carbon or germanium and the impurity concentration in the semiconductor region is a concentration of a p-type impurity.

13. The sensor according to claim 1, wherein the image sensor comprises a well region of the second conductivity type, the charge accumulation region and the well region form a photodiode serving as the photoelectric conversion element, an impurity concentration in the semiconductor region is higher than an impurity concentration in the well region, and the semiconductor region is arranged between the gettering region and the charge accumulation region.

14. The sensor according to claim 2, wherein in planar view to the semiconductor substrate, the gettering region and the semiconductor region surround the periphery of the first region, and the semiconductor region is arranged between the gettering region and the first region.

15. The sensor according to claim 2, wherein between the second region and the insulator isolation portion of the third region, the gettering region is not arranged along the insulator isolation portion between the well region and the insulator isolation portion.

16. The sensor according to claim 2, wherein in planar view to the semiconductor substrate, a periphery of the second region is surrounded by the well region and is not surrounded by the gettering region.

17. The sensor according to claim 1, wherein a position where a concentration half the peak of the impurity concentration in the charge accumulation region is obtained is deeper than a position where a concentration half the peak of the impurity concentration in the gettering region is obtained.

18. The sensor according to claim 1, wherein the gettering region is also arranged throughout inside of the insulator isolation portion.

* * * * *